(12) United States Patent
Kim et al.

(10) Patent No.: US 9,515,203 B2
(45) Date of Patent: Dec. 6, 2016

(54) SOLAR CELL AND METHOD FOR MANUFACTURING THE SAME

(71) Applicant: LG Electronics Inc, Seoul (KR)

(72) Inventors: Kisu Kim, Seoul (KR); Younghyun Lee, Seoul (KR); Sangwook Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 111 days.

(21) Appl. No.: 13/837,668

(22) Filed: Mar. 15, 2013

(65) Prior Publication Data
US 2014/0020747 A1    Jan. 23, 2014

(30) Foreign Application Priority Data

Jul. 18, 2012 (KR) .................. 10-2012-0078225

(51) Int. Cl.
*H01L 31/0224* (2006.01)
*H01L 31/0236* (2006.01)
*H01L 31/068* (2012.01)

(52) U.S. Cl.
CPC ... *H01L 31/022441* (2013.01); *H01L 31/0236* (2013.01); *H01L 31/022425* (2013.01); *H01L 31/068* (2013.01); *Y02E 10/547* (2013.01)

(58) Field of Classification Search
USPC .... 136/256, 255, 258, 259, 261; 438/72, 57, 438/98
See application file for complete search history.

(56) References Cited

U.S. PATENT DOCUMENTS

| | | | | |
|---|---|---|---|---|
| 4,152,824 A | * | 5/1979 | Gonsiorawski | 438/98 |
| 4,612,698 A | * | 9/1986 | Gonsiorawski et al. | 438/72 |
| 4,650,695 A | * | 3/1987 | Gregory | 427/527 |
| 2009/0223549 A1 | | 9/2009 | Ounadjela et al. | |
| 2011/0100459 A1 | * | 5/2011 | Yoon et al. | 136/259 |
| 2011/0272009 A1 | * | 11/2011 | Cabral et al. | 136/255 |
| 2013/0061916 A1 | * | 3/2013 | Baker-O'Neal et al. | 136/256 |

FOREIGN PATENT DOCUMENTS

| | | |
|---|---|---|
| JP | 2004-266023 A | 9/2004 |
| KR | 1020120026737 A | 3/2012 |
| WO | 2013/038328 A1 | 3/2013 |
| WO | 2013/085248 A1 | 6/2013 |

* cited by examiner

*Primary Examiner* — Jayne Mershon
(74) *Attorney, Agent, or Firm* — Dentons US LLP

(57) ABSTRACT

A method of manufacturing a solar cell includes: forming a dopant layer by doping a dopant to a semiconductor substrate; and forming an electrode electrically connected to the dopant layer. The forming of the electrode includes forming a metal layer on the dopant layer; and heat-treating the metal layer to form a first layer and a second layer. In the heat-treating of the metal layer, a portion of the metal layer adjacent to the semiconductor substrate forms the first layer including a compound formed by a reaction of the metal layer and the semiconductor substrate, and a remaining portion of the metal layer forms the second layer that covers the first layer.

15 Claims, 8 Drawing Sheets

ST10

ST20

ST30

ST40

SOLAR CELL AND METHOD FOR MANUFACTURING THE SAME

CROSS-REFERENCE TO RELATED APPLICATION

This application claims the priority benefit of Korean Patent Application No. 10-2012-0078225, filed on Jul. 18, 2012 in the Korean Intellectual Property Office, the disclosure of which is incorporated herein by reference.

BACKGROUND OF THE DISCLOSURE

1. Field of the Disclosure

The disclosure relates to a solar cell and a method for manufacturing the same, and more particularly, to a solar cell having an enhanced structure and a method for manufacturing the same.

2. Description of the Related Art

Recently, as existing energy resources such as oil or coal are expected to be exhausted, an interest in alternative energy for replacing oil or coal is increasing. In particular, a solar cell that directly converts or transforms solar energy into electricity is gaining attention as a next-generation cell. In a solar cell, a p-n junction is formed by forming a dopant layer of an n-type or a p-type in order to induce photoelectric conversion, and an electrode electrically connected to the dopant layer is formed.

The electrode is conventionally formed by using a paste. However, there is a limit to decreasing of a width of the electrode. Also, precise alignment is necessary. In addition, contact property between the electrode and the dopant layer (or the semiconductor substrate) is not good. Accordingly, productivity and efficiency of the solar cell are reduced.

SUMMARY

Embodiments of the invention are directed to a solar cell having enhanced properties and a method for a solar cell having a high productivity.

A method of manufacturing a solar cell according to an embodiment of the invention includes: forming a dopant layer by doping a dopant to a semiconductor substrate; and forming an electrode electrically connected to the dopant layer. The forming of the electrode includes forming a metal layer on the dopant layer; and heat-treating the metal layer to form a first layer and a second layer. In the heat-treating of the metal layer, a portion of the metal layer adjacent to the semiconductor substrate forms the first layer including a compound formed by a reaction of the metal layer and the semiconductor substrate, and a remaining portion of the metal layer forms the second layer that covers the first layer.

A solar cell according to an embodiment of the invention includes a semiconductor; a dopant layer formed at the semiconductor substrate;

and an electrode electrically connected to the dopant layer. The electrode at least includes a barrier layer being in contact with the semiconductor substrate or the dopant layer. The barrier layer includes a first layer and a second layer on the first layer, where the second layer includes a metal. The first layer includes a compound formed by a reaction of the metal of the second layer and the semiconductor substrate.

DETAILED DESCRIPTION OF THE PREFERRED EMBODIMENTS

Figure 1:
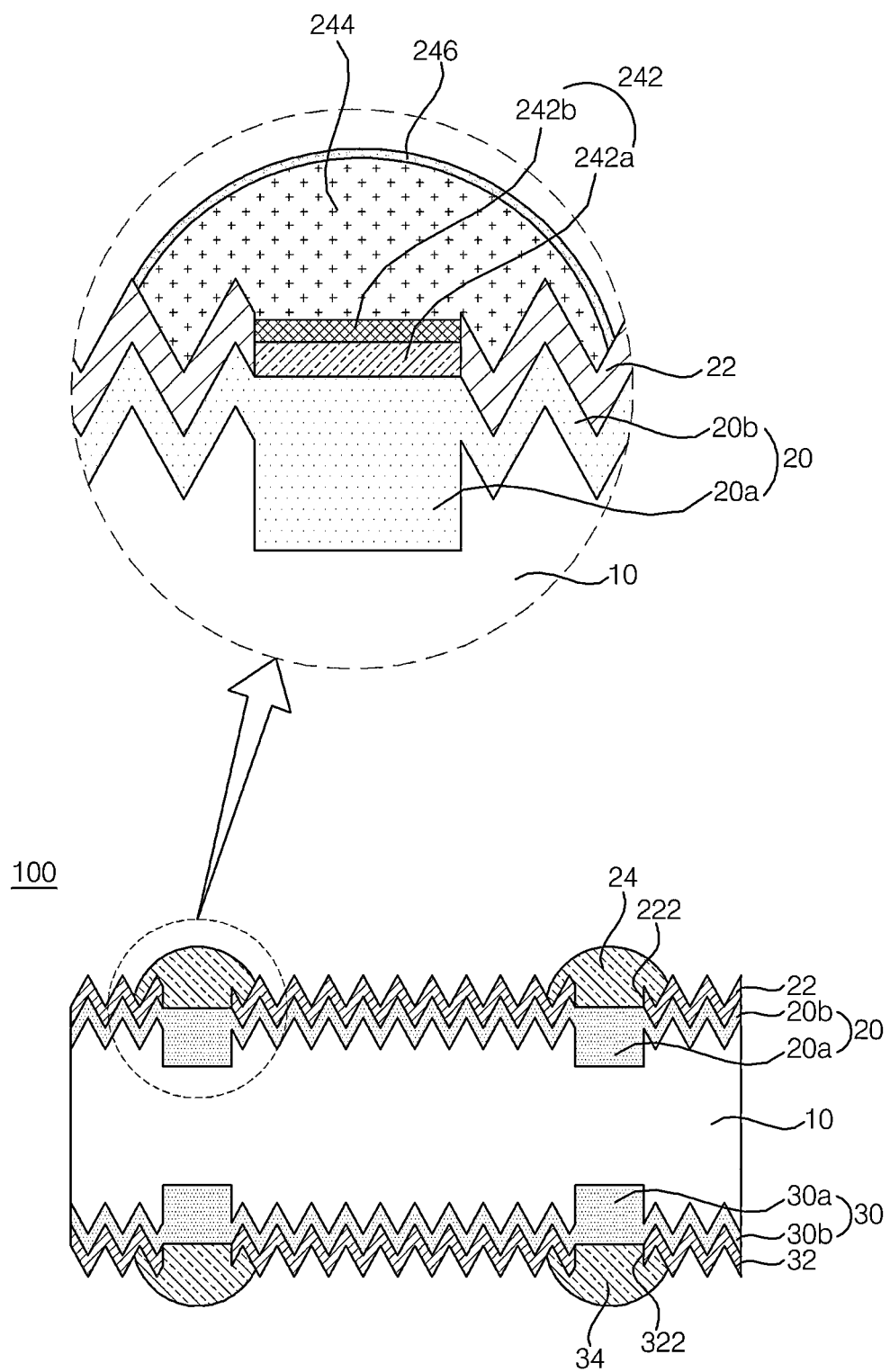
FIG. 1 is a cross-sectional view of a solar cell according to an embodiment of the invention.

Hereinafter, embodiments of the invention will be described with reference to the accompanying drawings. However, the invention is not limited the embodiments, and the various modifications of the embodiments are possible.

In order to clearly and concisely illustrate the embodiments of the invention, elements not related to the invention may be omitted in the figures. Also, elements similar to or same as each other may have same reference numerals. In addition, the dimensions of layers and regions may be exaggerated or schematically illustrated, or some layers may be omitted for clarity of illustration. In addition, the dimension of each part as drawn may not reflect an actual size.

In the following description, when a layer or substrate "includes" another layer or portion, it can be understood that the layer or substrate further includes still another layer or portion. Also, when a layer or film is referred to as being "on" another layer or substrate, it can be understood that the layer of film is directly on the other layer or substrate, or intervening layers are also present. Further, when a layer or film is referred to as being "directly on" another layer or substrate, it can be understood that the layer or film is directly on the another layer or substrate, and thus, there is no intervening layer.

Hereinafter, a solar cell and a method for manufacturing the same according to embodiments of the invention will be described with reference to the accompanying drawings.

FIG. 1 is a cross-sectional view of a solar cell according to an embodiment of the invention.

Referring to FIG. 1, a solar cell 100 according to an embodiment includes a semiconductor substrate 10, dopant layers 20 and 30 formed at the semiconductor substrate 10, and electrodes 24 and 34 electrically connected to the dopant layers 20 and 30. More specifically, the dopant layers 20 and 30 may include an emitter layer 20 and a back surface field layer 30. Also, the electrodes 24 and 34 may include a first electrode (or a plurality of first electrodes) 24 electrically connected to the emitter layer 20, and a second electrode (or a plurality of second electrodes) 34 electrically connected to the back surface field layer 30. In addition, the solar cell 100 may further include an anti-reflection layer 22 and a passivation layer 32. This will be described in more detail.

The semiconductor substrate 10 may include one or more of various semiconductor materials. For example, the semiconductor substrate 10 includes silicon having a second conductivity type dopant. Single crystal silicon or polycrystalline silicon may be used for the silicon, and the second conductivity type may be an n-type. That is, the semiconductor substrate 10 may include single crystal silicon or polycrystalline silicon having a group V element, such as phosphorus (P), arsenic (As), bismuth (Bi), antimony (Sb), or the like.

When the semiconductor substrate 10 has the n-type dopant as in the above, the emitter layer 20 of a p-type is formed at the front surface of the semiconductor substrate 10, and thereby forming a p-n junction. When the sun light is incident to the p-n junction, the electrons generated by the photoelectric effect move to the back surface of the semiconductor substrate 10 and are collected by the second electrode 34, and the holes generated by the photoelectric effect move to the front surface of the semiconductor substrate 10 and are collected by the first electrode 24. Then, the electric energy is generated. Here, the holes having mobility lower than that of the electrodes move to the front surface of the semiconductor substrate 10, and not the back surface of the semiconductor substrate 10. Therefore, the conversion efficiency of the solar cell 100 can be enhanced.

However, the invention is not limited thereto. Thus, the semiconductor substrate 10 and the back surface field layer 30 may be the p-types, and the emitter layer 20 may be the n-type.

The front and back surfaces of the semiconductor substrate 10 may be a textured surface to have protruded and/or depressed portions of various shapes (such as pyramid shape). Thus, the surface roughness is increased by the protruded and/or depressed portions, and reflectance of the incident sun light at the front surface of the semiconductor substrate 10 can be reduced by the texturing. Then, an amount of the light reaching the p-n junction between the semiconductor substrate 10 and the emitter layer 20 can increase, thereby reducing an optical loss of the solar cell 100.

However, in the embodiment, the protruded and/or depressed portions by texturing are not formed at portions of the front and back surfaces of the semiconductor substrate 10 where the electrodes 24 and 34 are formed. This is induced by a method for manufacturing the solar cell 100, and it will be described later in detail. The portions where the electrodes 24 and 34 are not formed are not actually the portions where the light is incident. Thus, the fact that the portions do not have the protruded and/or depressed portions does not affect the light loss.

The emitter layer 20 having the first conductive type dopant may be formed at the front surface of the semiconductor substrate 10. A p-type dopant such as a group III element (for example, boron (B), aluminum (Al), gallium (Ga), indium (In) or the like) may be used for the first conductive type dopant.

Here, in the embodiment, the emitter layer 20 may include a first portion 20a formed adjacent to and in contact with a part or a whole portion (that is, at least a part) of the first electrode 24, and a second portion 20b other than the first portion 20a. The first portion 20a has a doping concentration higher than that in the second portion 20b, and thus, the first portion 20a has a resistance lower than that of the second portion 20b.

Then, the shallow emitter can be achieved by forming the second portion 20b with a relatively low resistance at a portion corresponding to a portion between the first electrodes 24 where the sunlight is incident. Accordingly, current density of the solar cell 100 can be enhanced. In addition, contact resistance with the first electrode 24 can be reduced by forming the first portion 20a with a relatively low resistance at a portion adjacent to the first electrode 24. That is, since the emitter layer 20 has a selective emitter structure, the efficiency of the solar cell 100 can be maximized.

In the embodiment, the emitter layer 20 is formed at the front surface of the semiconductor substrate 10. However, the invention is not limited thereto. That is, the emitter layer 20 may extend to the back surface of the semiconductor substrate 10. In this case, the solar cell 100 is a back contact solar cell.

The anti-reflection layer 22 and the first electrode 24 may be formed on the semiconductor substrate 10 or on the emitter layer 20 formed at the semiconductor substrate 10).

The anti-reflection layer 22 may be substantially formed at the entire front surface of the semiconductor substrate 10, except for the portion where the first electrode 24 is formed. The anti-reflection layer 22 reduces reflectance (or reflectivity) of sun light incident to the front surface of the semiconductor substrate 10. Also, the anti-reflection layer 22 passivates defects at a surface or a bulk of the emitter layer 20.

By reducing the reflectance of sun light incident to the front surface of the semiconductor substrate 10, an amount of the sun light reaching the p-n junction formed between the semiconductor substrate 10 and the emitter layer 20 can be increased, thereby increasing short circuit current (Isc) of the solar cell 100. Also, by passivating the defects at the emitter layer 20, recombination sites of minority carrier are reduced or eliminated, thereby increasing an open-circuit voltage (Voc) of the solar cell 100. Accordingly, the open-circuit voltage and the short-circuit current of the solar cell 100 can be increased by the anti-reflection layer 22, and thus, the efficiency of the solar cell 100 can be enhanced.

The anti-reflection layer 22 may include one or more of various materials. Thus, the anti-reflection layer 22 may have a single film structure or a multi-layer film structure including, for example, at least one material selected from a group consisting of silicon nitride, silicon nitride including hydrogen, silicon oxide, silicon oxy nitride, aluminum oxide, $MgF_2$, ZnS, $TiO_2$ and $CeO_2$. However, the invention is not limited thereto. The anti-reflection layer 22 may includes one or more of various materials. Also, a front passivation layer (not shown) may be included between the semiconductor substrate 10 and the anti-reflection layer 22.

The first electrode 24 is electrically connected to the emitter layer 20 through an opening 222 formed at the anti-reflection layer 22 (that is, penetrating the anti-reflection layer 22). The first electrode 24 may have various shapes and may include one or more of various materials. This will be described later.

The back surface field layer 30 including the second conductive type dopant is formed at the back surface of the semiconductor substrate 10. The doping concentration of the back surface field layer 30 may be higher than the doping concentration of the semiconductor substrate 10 where the emitter layer 20 and the back surface field layer 30 are not formed. A n-type dopant of a group V element, such as phosphorus (P), arsenic (As), bismuth (Bi), antimony (Sb), or the like may be used for the second conductive type dopant of the back surface field layer 30.

In the embodiment, the back surface field layer 30 may include a first portion 30a formed adjacent to and in contact with a part or a whole portion (that is, at least a part) of the second electrodes 34, and a second portion 30b other than the first portion 30a. The first portion 30a has a doping concentration higher than that in the second portion 30b, and thus, the first portion 30a has a resistance lower than that of the second portion 30b.

Then, the recombination of the electrons and the holes may be prevented by forming the second portion 30b with a relatively high resistance at a portion corresponding to a portion between the second electrodes 34, and thereby enhancing the current density of the solar cell 100. In addition, contact resistance with the second electrode 34 can be reduced by forming the first portion 30a with a relatively low resistance at a portion adjacent to the second electrode 34. That is, since the back surface field layer 30 has a selective back surface field structure, the efficiency of the solar cell 100 can be maximized.

The passivation layer 32 and the second electrode 34 may be formed on the back surface of the semiconductor substrate 10.

The passivation layer 32 may be substantially at the entire back surface of the semiconductor substrate 10, except for the portions where the second electrode 34 is formed. The passivation layer 32 passivates defects at the back surface of the semiconductor substrate 10, and eliminates the recombination sites of minority carrier. Thus, an open circuit voltage of the solar cell 100 can be increased.

The passivation layer 32 may include a transparent insulating material for passing the light. Thus, the light can be incident to the back surface of the semiconductor substrate 10 through the passivation layer 32, and thereby enhancing the efficiency of the solar cell 100. The passivation layer 32 may have a single film structure or a multi-layer film structure including, for example, at least one material selected from a group comprising silicon nitride, silicon nitride including hydrogen, silicon oxide, silicon oxy nitride, aluminum oxide, $MgF_2$, ZnS, $TiO_2$ and $CeO_2$. However, the invention is not limited thereto, and thus, the passivation layer 32 may include one or more of various materials.

The second electrode 34 is electrically connected to the back surface field layer 30 through an opening 322 formed at the passivation layer 32 (that is, by penetrating the passivation layer 32). The second electrode 34 may have various shapes and may include one or more of various materials.

That is, the first electrodes 24 and/or second electrodes 34 may have various plan shapes. An example of the plan shape of first electrodes 24 and/or second electrodes 34 will be described with reference to FIG. 2. Although the first electrode 24 and the second electrode 34 may have different widths, pitches, and so on, shapes of the first electrode 24 and the second electrode 34 may be similar. Therefore, hereinafter, the first electrode 24 will be described only, and the descriptions of the second electrode 34 will be omitted. The following descriptions may be applied to one or both of the first electrode 24 and the second electrode 34.

Figure 2:
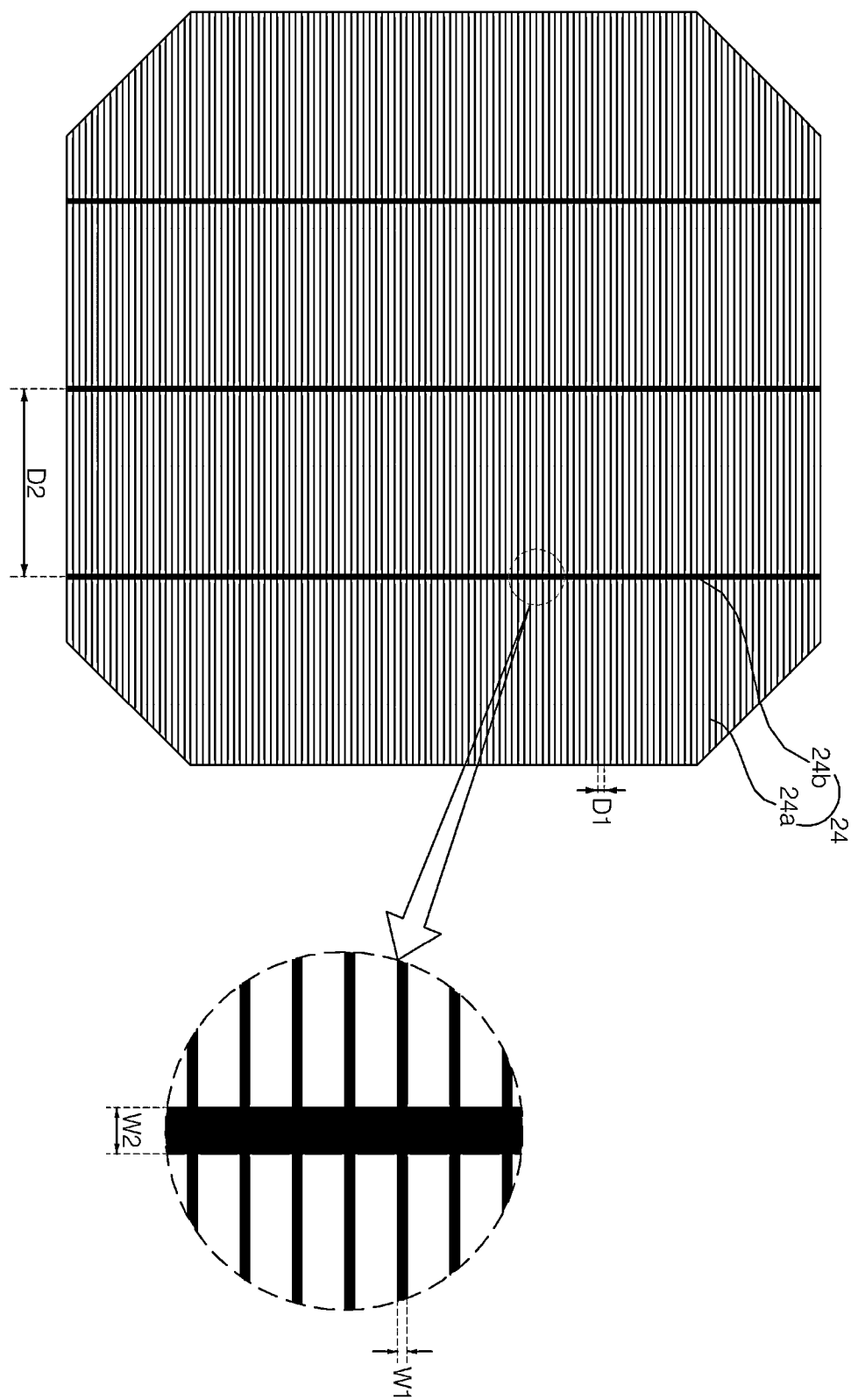
FIG. 2 is a plan view of the solar cell shown in FIG. 1.

Referring to FIG. 2, the first electrode 24 may include a plurality of finger electrodes 24a. The finger electrodes 24a are parallel to each other and are spaced apart from each other with a first pitch D1. Also, the first electrode 24 may include a bus electrode 24b being extended in a direction crossing the finger electrodes 24a to connect the finger electrodes 24a. The bus electrode 24b may include a single bus electrode 24b, or the bus electrode 24b includes a plurality of bus electrodes 24b as shown in FIG. 2. The plurality of bus electrodes 24b may be spaced apart from each other with a second distance D2 larger than the first distance D1. Also, the finger electrode 24a may have a width W1 smaller than a width W2 of the bus bar electrode 24b. However, the invention is not limited thereto. Thus, the finger electrode 24a may have a width W1 same as a width W2 of the bus bar electrode 24b. That is, the shape of the first electrode 24 is just an example, and the invention is not limited thereto. Also, the first electrode 24 may include one or more of various materials.

When viewed in a cross-sectional view, both of the finger electrodes 24a and the bus bar electrode 24b may penetrate the anti-reflection layer 22 (the passivation layer 32 in the case of the second electrode 34). Selectively, the finger electrodes 24a may penetrate the anti-reflection layer 22 and the bus bar electrode 24b may be formed on the anti-reflection layer 22.

Also, referring to FIG. 1 again, the first and second electrodes 24 and 34 may have a plurality of metal layers stacked to each other to enhance various properties. Since the first and second electrodes 24 and 34 may have the same stacking structure, only the structure of the first electrode 24 is shown in FIG. 1. Also, the following descriptions of the stacking structure may be applied to one or both of the first and second electrodes 24 and 34.

The first electrode 24 may include a barrier layer 242, a conductive layer 244, and a capping 246 sequentially stacked on the emitter layer 20, which is a dopant layer.

Here, the barrier layer 242 is formed by coating one material and heat-treating the same. The barrier layer 242 includes a first layer 242a and a second layer 242b, where a material of the first layer 242a and a material of the second layer are different to each other. Here, the meaning of "different" includes a case where the chemical composition is different although same elements and material are included, as well as a case that the element or the material is different.

In this case, the first layer 242a is formed on and is in contact with the semiconductor substrate 10 (for example, the first portion 20a of the emitter layer 20 formed at the semiconductor substrate 10). The first layer 242a may include a compound formed by a reaction of a metal of the second layer 242b and the semiconductor material of the semiconductor substrate 10. That is, if a material (or materials) or an element (or elements) of the second layer 242b is coated on the semiconductor substrate 10 and is heat-treated, an compound is formed by the reaction of the semiconductor material of the semiconductor substrate 10 and the material or the element of the second layer 242b, thereby forming the first layer 242a.

For example, the second layer 242b may include a metal of nickel (Ni), platinum (Pt), titanium (Ti), cobalt (Co), tungsten (W), molybdenum (Mo), tantalum (Ta), or the like. The first layer 242a may include silicide (for example, NiSi, $NiSi_2$, PtSi, $Co_2Si$, CoSi, $CoSi_2$, $WSi_2$, $MoSi_2$, TaSi) formed by the reaction of the metal of the second layer 242b and silicon of the semiconductor substrate 10.

Here, when the metal of the second layer 242b includes Ni and the first layer 242a includes NiSi, the NiSi of the first layer 242a has excellent properties, and the second layer 242b including Ni entirely covers the first layer 242a, and thereby enhancing various properties. This will be described later in more detail. Although it is not shown, $Ni_2Si$ may be formed between the first layer 242a and the second layer 242b, on the second layer 242b, or as a part of the first layer 242a or the second layer 242b. Because the $Ni_2Si$ has high electrical property, the $Ni_2Si$ can enhance electrical property between the semiconductor substrate 10 and the barrier layer 242. However, the invention is not limited thereto. The above various metal may be used as the second layer 242b, and thus, the first layer 242a may be include one or more of the above various materials.

Hereinafter, the case that the metal of the second layer 242b is Ni and the compound of the first layer 242a is NiSi will be described as an example. That is, the first layer 242a and the second layer 242b are formed by forming a Ni layer inside the opening 222 of the anti-reflection layer 22 (in the case of the second electrode 34, the opening 322 of the passivation layer 32) and heat-treating the same. That is, a lower portion of the Ni layer reacts with the Si of the semiconductor substrate 10 and the Nisi layer is formed. An upper portion of the Ni layer is remained on the NiSi layer without reaction. The NiSi layer forms the first layer 242a, and the remained Ni layer forms the second layer 242b. This will be described in the method for manufacturing the solar cell 100.

The first layer 242a including the NiSi has very small contact resistance with the silicon of about 2.8~2.95Ω/□. The first layer 242a including the NiSi has low thermal stress, and thus, thermal stability is high. Also, adhesive force is excellent. In addition, the silicon amount used for forming the silicide is small, and the surface roughness and reflectance can be controlled.

The second layer 242b including the Ni covers the first layer 242a, and prevents problems generated at a portion where the first layer 242a is not formed. That is, by errors or mistakes of a manufacturing process, there may be a portion where the first layer 242a is thin or the first layer 242a is not formed. At this portion, the contact resistance may increase. Also, the material of the conductive layer 244 is diffused toward the semiconductor substrate 10, thereby deteriorating the electrical property. In severe cases, shunt may be generated. In the embodiment, the second layer 242b covers the portion where the first layer 242a is not formed, and thus, the problems due to the increase of the contact resistance and the metal diffusion can be prevented.

Also, the first layer 242a and the second layer 242b have lattice mismatch, and bonding energy between the second layer 242b and the conductive layer 244 (for example, copper (Cu)) is high. Accordingly, when the metal of the conductive layer 244 penetrates the second layer 242b and the first layer 242a and proceeds to the semiconductor substrate 10, the first layer 242a and the second layer 242b act as a double barrier. That is, since the first layer 242a and the second layer 242b form a structure of double-diffusion-prevention, the metal diffusion of the conductive layer 244 to the semiconductor substrate 10 can be effectively prevented.

Here, in the embodiment, the Ni layer is formed, and then, the first layer 242a and the second layer 242b are formed by heat-treatment. The first layer 242a of the NiSi can be formed at the lower portion and the second layer 242b of the Ni can be remained on the first layer 242a. Accordingly, an additional process for forming the second layer 242b on the first layer 242a is not necessary. Finally, the first layer 242a of NiSi and the second layer 242b of Ni can be formed by a simple process.

For example, a thickness ratio of the first layer 242a:the second layer 242b may be in a range of about 1:0.1~20. When the thickness ratio is smaller than 1:0.1, the second layer 242b may be thin and may not entirely cover the first layer 242a. When the thickness ratio is larger than 1:20, the first layer 242a may be thin and the effect by the first layer 242a may be not sufficient. Also, when the thickness ratio is larger than 1:20, the second layer 242b may be thick and the specific resistance may increase.

More specifically, the first layer 242a may be thicker than the second layer 242b. Then, because the first layer 242a is relatively thick, the adhesive property with the first electrode 24 can be enhanced by low contact resistance, enhanced thermal stability, and high contact force. Also, the second layer 242b has a thickness being able to cover the first layer 242a. In addition, when the second layer 242b is excessively thick, the specific resistance may increase.

The first layer 242a may have a thickness of about 0.2~2.5 µm, and the second layer 242b may have a thickness of about 0.1~1 µm. When the thickness of the first layer 242a is smaller than about 0.2 µm, the effect by the first layer 242a may be not sufficient and there may be a portion where the first layer 242a is not formed. Also, when the thickness of the first layer 242a is larger than about 2.5 µm, a cost due to the material may increase and the process time may increase. When thickness of the second layer 242b is smaller than about 0.1 µm, there may be a portion where the second layer 242b does not cover the first layer 242a. In addition, when the second layer 242b is larger than about 1 µm, the cost and the process time may increase and the specific resistance may increase.

Also, the barrier layer 242 may have a width of about 5~20 µm (for example, about 8~12 µm). In the embodiment, since the opening 222 is formed by a laser and self-aligning is possible, large process margin is not necessary, thereby reducing the width greatly. This will be described later in more detail. In the embodiment, by reducing the widths of the electrodes 24 and 34, the shading loss can be minimized. Thus, the efficiency of the solar cell 100 can be enhanced.

The conductive layer 244 formed on the second layer 242b may be formed of a metal material having high electrical conductivity. Because the conductive layer 244 is the thickest layer among the first electrode 24, the conductive layer 244 may be formed of a material having the high electrical conductivity and being cheap. For example, the conductive layer 244 may include copper (Cu). However, the invention is not limited thereto. Thus, the conductive layer 244 may include silver (Ag), gold (Au), or the like.

The conductive layer 244 may be thicker than the barrier layer 242 or the capping layer 246. Also, the conductive layer 244 may be wider than the barrier layer 242, and may be formed on the anti-reflection layer 22 adjacent to both sides of the second layer 242b, as well as on the second layer 242b. This is because the conductive layer 244 is laterally grown when it is formed by a plating method or the like. However, the invention is not limited thereto.

For example, the conductive layer 244 may have a thickness of about 10~30 µm, and have a width of about 10~40 µm (for example, about 10~25 µm). When the thickness is larger than about 30 µm, the manufacturing cost may increase. When the thickness is smaller than about 10 µm, the current may not flow smoothly. When the width is larger than about 40 µm, the shading loss may increase and the manufacturing cost may increase. When the width is smaller than about 10 µm, the current may not flow smoothly.

The capping layer 246 formed on the conductive layer 244 is a layer for enhancing adhesive property with a ribbon and for protecting the conductive layer 244. The capping layer 246 may include tin (Sn), silver (Ag), or the like.

For example, the capping layer 246 may have a thickness of about 1~10 µm (for example, about 5~10 µm), and a width of about 10~40 µm (for example, about 10~25 µm). When the thickness is larger than about 10 µm, the manufacturing cost may increase. When the thickness is smaller than about 1 µm, the effect for enhancing the adhesive property may be small. When the width is larger than about 40 µm, the shading loss and the manufacturing cost may increase. When the width is smaller than about 10 µm, the capping layer 246 may not entirely cover the conductive layer 244.

In the drawings and the description, each of the conductive layer 244 and the capping layer 246 are formed on the barrier layer 242, and has a single layer. However, the conductive layer 244 and/or the capping layer 246 may include two or more layers. Also, the conductive layer 244 and the capping layer 246 may include same material, and thus, the conductive layer 244 and the capping layer 246 may be formed as one layer. Accordingly, at least one metal layer may be formed on the barrier layer 242. Selectively, according to embodiments, an additional metal layer is not formed on the barrier layer 242, and the barrier layer 242 itself forms the electrode.

Hereinafter, a method for forming the electrodes 24 and 34 and a method for manufacturing the solar cell 100 including the same will be described in more detail with reference to FIGS. 3a to 3e, and FIGS. 4a to 4d. In the following descriptions, the described portions in the above will be omitted, and the not-described portions in the above will be described in detail.

FIGS. 3a to 3e are cross-sectional views for illustrating a method for manufacturing a solar cell according to an embodiment of the invention.

Figure 3A:
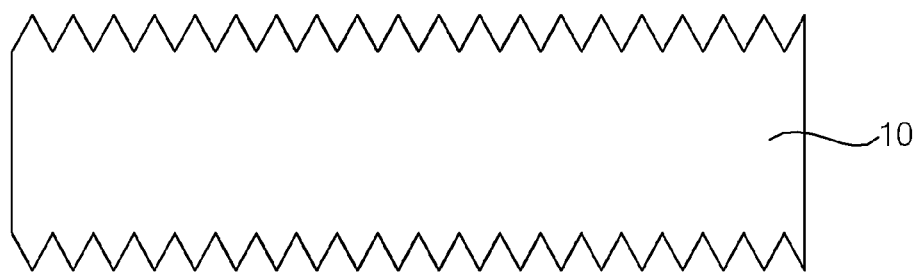
FIGS. 3a to 3e are cross-sectional views for illustrating a method for manufacturing a solar cell according to an embodiment of the invention.

First, as shown in FIG. 3a, in a step ST10 for preparing a semiconductor substrate, a semiconductor substrate 10 having a second conductive type dopant is prepared. Here, the front and/or back surfaces of the silicon semiconductor substrate 10 may be textured to have protruded and/or dented portions of various shapes (or to have an uneven surface).

For the texturing method, a wet etching method or a dry etching method may be used. In the wet etching method, the semiconductor substrate 10 may be dipped into a texturing solution. According to the wet etching method, the process time can be short. In the dry etching method, the surface of the semiconductor substrate 10 is etched by a diamond drill or a laser. In the dry etching, the protruded and/or dented portions can be uniformly formed; however, the semiconductor substrate 10 may be damaged and the process time may be long. Selectively, one of the front surface and the back surface of the semiconductor substrate 10 may be textured by reactive ion etching (RIE). Accordingly, the semiconductor substrate 10 may be textured by one or more of various methods.

Figure 3B:
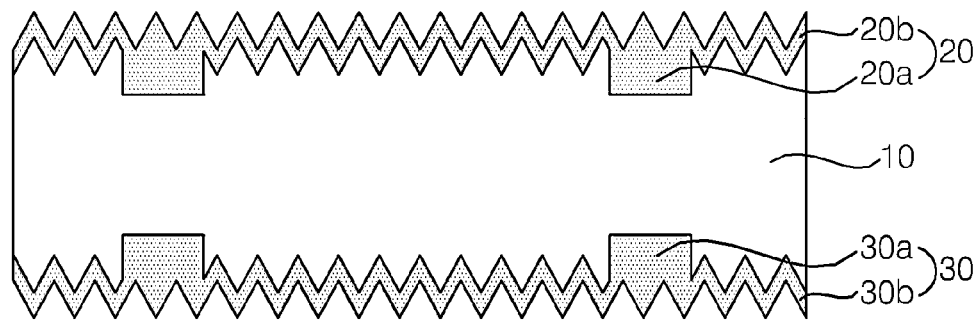

Next, as shown in FIG. 3b, in a step ST20 for forming dopant layers, an emitter layer 20 and a back surface field layer 30 as dopant layers are formed at the semiconductor substrate 10.

The emitter layer 20 and the back surface field layer 30 may be formed by a thermal diffusion method, an ion-implantation method, or the like. In the thermal diffusion method, in the state that the semiconductor substrate 10 is heated, a gaseous compound (for example, $BBr_3$ or $POCl_3$) including the first or second conductive type dopant is diffused to dope the dopant. The manufacturing process of the thermal diffusion method is simple, and thus, the manufacturing cost is low. In the ion-implantation method, the dopant is ion-implanted. According to the ion-implantation method, the doping in a lateral direction can be reduced, and thus, the degree of accumulation can be increased and the concentration can be easily controlled. Also, because only one surface of the semiconductor substrate 10 is ion-implanted, the ion-implantation method can be easily used when the front surface and the back surface of the semiconductor substrate 10 are doped with different dopants.

The back surface field layer 30 may be formed after forming the emitter layer 20. Selectively, the emitter layer 20 may be formed after forming the back surface field layer 30.

The emitter layer 20 and the back surface field layer 30 having the selective structures may be formed, for example, by using a comb mask or a laser. Selectively, the emitter layer 20 and the back surface field layer 30 having the selective structures may be formed by additionally doping the dopant only to the first portions 20a and 30a. That is, the emitter layer 20 having the first and second portions 20a and 20b and the back surface field having the first and second portions 30a and 30b may be formed by one or more of various methods.

Figure 3C:
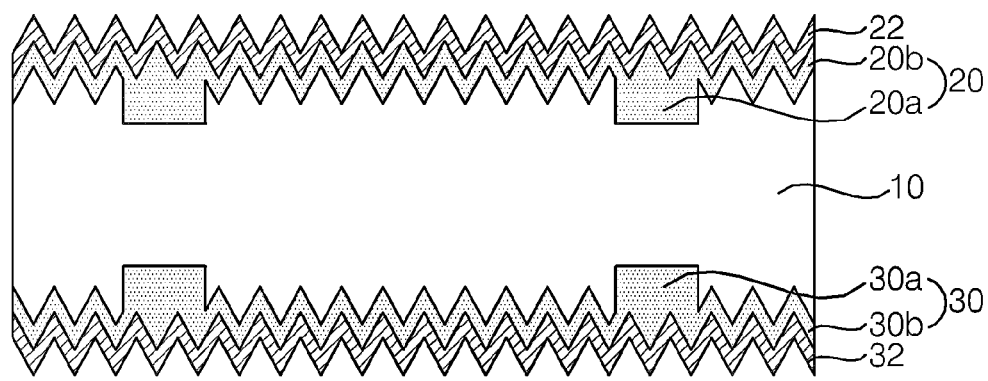

Next, as shown in FIG. 3c, in a step ST30 for forming an anti-reflection film and a passivation layer, an anti-reflection film 22 and a passivation film 32 are entirely formed on the front surface and the back surface of the semiconductor substrate 10, respectively. The anti-reflection film 22 and the passivation film 32 may be formed by one or more of various methods such as a vacuum evaporation, a chemical vapor deposition, a spin coating, a screen printing, or a spray coating.

Figure 3D:
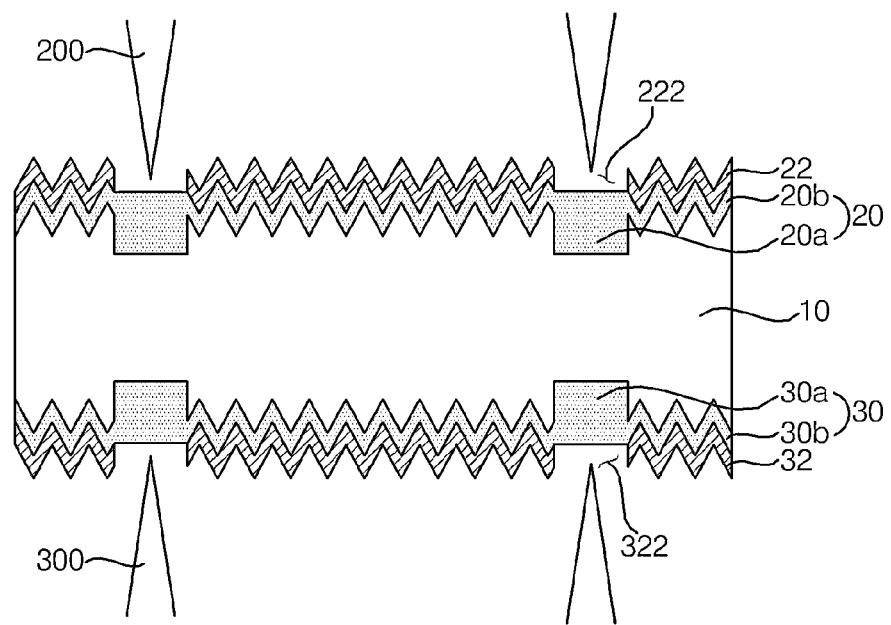

Next, as shown in FIG. 3d, in a step ST40 for forming an opening, the opening 222 is formed at the anti-reflection layer 22, and the opening 322 is formed at the passivation layer 32.

The openings 222 and 322 may be formed by one or more of various methods. In the embodiment, the openings 222 and 322 are formed by using lasers 200 and 300. That is, the lasers 200 and 300 are irradiated to portions corresponding to the first portions 20a and 30a of the anti-reflection layer 22 and the passivation layer 32, respectively. Thus, the corresponding portions are selectively heated, thereby forming the openings 222 and 322.

Here, the protruded and/or depressed portions formed by texturing are eliminated at the portions where the openings 222 and 322 are formed. Hereby, portions of the semiconductor substrate 10 where the openings 222 and 322 are formed are flatter than the other portions, and have surface roughness smaller than the other portions.

According to the embodiment, when the openings 222 and 322 are formed by using the lasers 200 and 300, the anti-reflection layer 22 and the passivation layer 32 can be selectively heated according to a pattern data of a laser apparatus, and the widths of the openings 222 and 322 can be minimized. For example, the openings 222 and 322 may have widths of about 5~20 μm (for example, 8~12 μm).

Here, after irradiating the laser 200 to the front surface of the semiconductor substrate 10 in order to form the opening 222 at the anti-reflection film 22, the laser 300 may be irradiated to the back surface of the semiconductor substrate 10 in order to form the opening 322 at the passivation film 32. Selectively, after irradiating the laser 300 to the back surface of the semiconductor substrate 10 in order to form the opening 322 at the passivation film 32, the laser 200 may be irradiated to the front surface of the semiconductor substrate 10 in order to form the opening 222 at the anti-reflection film 22.

Also, as shown in FIG. 3d, the lasers 200 and 300 may be simultaneously irradiated to the front and back surfaces of the semiconductor substrate 10 in order to simultaneously form the opening 222 at the anti-reflection film 22 and the opening 322 at the passivation film 32. In this case, the process can be simplified more.

Figure 3E:
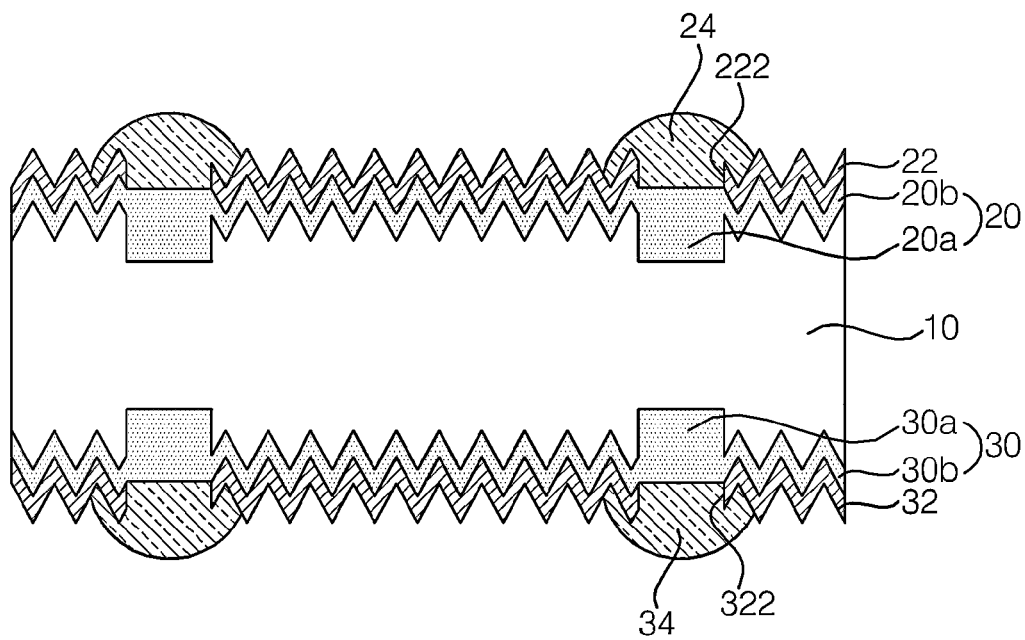

Next, as shown in FIG. 3e, in a step ST50 for forming electrodes, the first and second electrodes 24 and 34 are formed to fill inside of the openings 222 and 322, respectively. After forming the first electrode 24, the second electrode 34 may be formed. After forming the second electrode 34, the first electrode 24 may be formed. Selectively, the first electrode 24 and the second electrode 34 may be formed in the same process.

A method for forming the first electrode 24 and the second electrode 34 will be described in more detail with reference to FIGS. 4a to 4d.

FIGS. 4a to 4d are partial cross-sectional views for illustrating a method for manufacturing an electrode in the method for manufacturing the solar cell according to an embodiment of the invention. As stated in the above, the stacked structures of the first electrode 24 and the second electrode 34 are similar. Therefore, hereinafter, the first electrode 24 will be described only, and the descriptions of the second electrode 34 will be omitted. The following descriptions may be applied to one or both of the first electrode 24 and the second electrode 34.

Figure 4A:
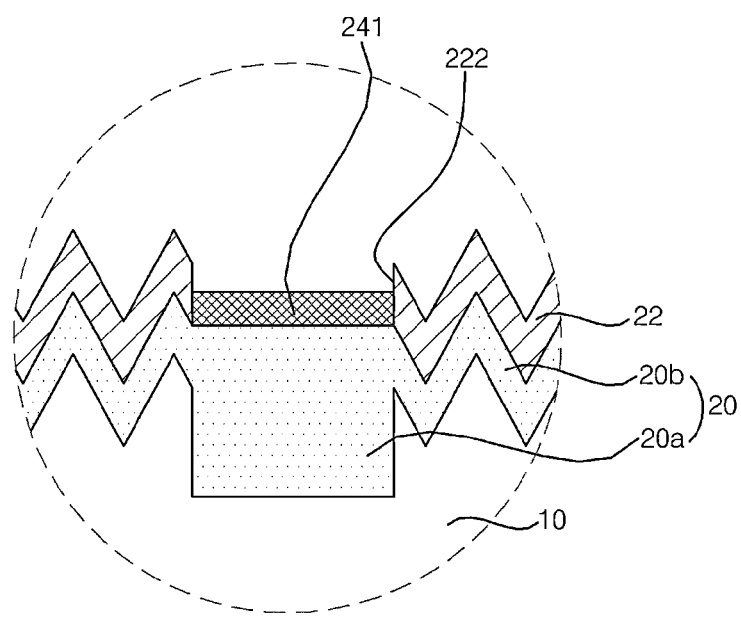
FIGS. 4a to 4d are partial cross-sectional views for illustrating a method for manufacturing an electrode in the method for manufacturing the solar cell according to an embodiment of the invention.

First, as shown in FIG. 4a, a metal layer 241 is formed on a portion the semiconductor substrate 10 (for example, on the first portion 20a of the emitter layer 20 formed on the semiconductor substrate 10) exposed by the opening 222 of the anti-reflection layer 22. The metal layer 241 is a layer for forming a barrier layer (242 in FIG. 1) of the embodiment.

The metal layer 241 may be formed by an electro plating method (for example, light induced plating, electroplating using electrolyte, and so on), an electroless plating method, or a deposition method (for example, physical vapor deposition such as sputtering, or chemical vapor deposition). Here, the metal layer 241 may be formed only on the portion the semiconductor substrate 10 is exposed by the opening 222 of the anti-reflection layer 22. The metal layer 241 may include one or more of various metals being able to form a compound by reacting with a material or an element of the semiconductor substrate 10. For example, the metal layer 241 may include Ni.

In the embodiment, the metal layer 241 may have a thickness of about 0.2~2 μm. The metal layer 241 of the embodiment is thicker than a metal layer for forming the conventional barrier layer. Hereby, in the embodiment, a second layer (242b of FIG. 4b) can be formed on a first layer (242a of FIG. 4b) after heat-treating. This will be described in more detail in the descriptions related to FIG. 4b.

When the thickness of the metal layer 241 is larger than about 2 μm, a manufacturing cost may increase and specific resistance may increase. When the thickness of the metal layer 241 is smaller than about 0.2 μm, the second layer 242b may be formed insufficiently.

Figure 4B:
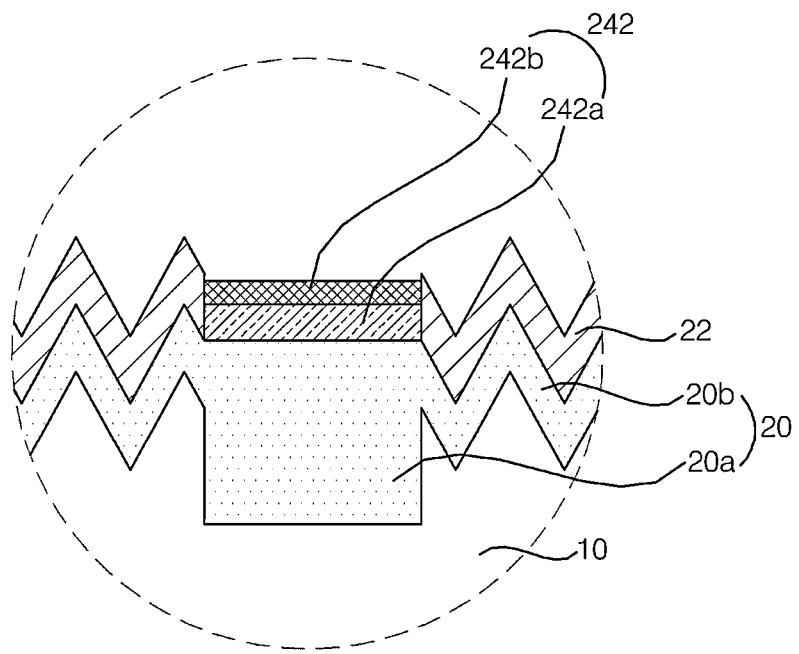

Next, as shown in FIG. 4b, a barrier layer 242 including the first layer 242a and the second layer 242b are formed by heat-treating.

In the embodiment, the heat-treating temperature may be in a range of about 250~400° C. (for example, 250~300° C.). This heat-treating temperature is slightly smaller than the conventional heat-treating temperature. The heat-treating temperature is determined to induce firing well and to react only to a lower portion of the metal layer (241 of FIG. 4a) with the semiconductor substrate 10.

Accordingly, silicide is formed by reacting the material or the element of the lower portion of the metal layer 241 and the material or the element of the semiconductor substrate 10. Thus, the first layer 242a including the silicide is formed adjacent to the semiconductor substrate 10 (for example, adjacent to the first portion 20a of the emitter layer 20 formed on the semiconductor substrate 10). When the metal layer 241 includes Ni, the first layer 242a may include NiSi.

The second layer 242b is a portion that is an upper portion of the metal layer 241 remaining without reaction. Thus, the second layer 242b includes same material as the metal layer 241.

Here, as stated in the above, the thickness ratio of the first layer 242a:the second layer 242b may be in a range of about 1:0.1~20. More specifically, the first layer 242a may be thicker than the second layer 242b. Also, the first layer 242a may have a thickness of about 0.2~2.5 μm, and the second layer 242b may have a thickness of about 0.1~1 μm. In addition, the barrier layer 242 may have a width of about 5~20 μm (for example, about 8~12 μm).

Figure 4C:
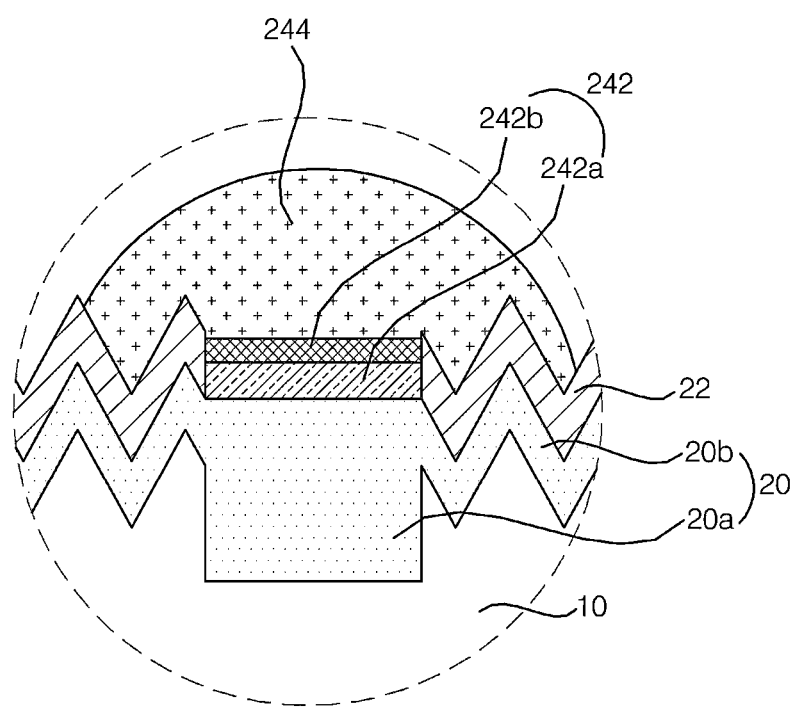
Figure 4D:
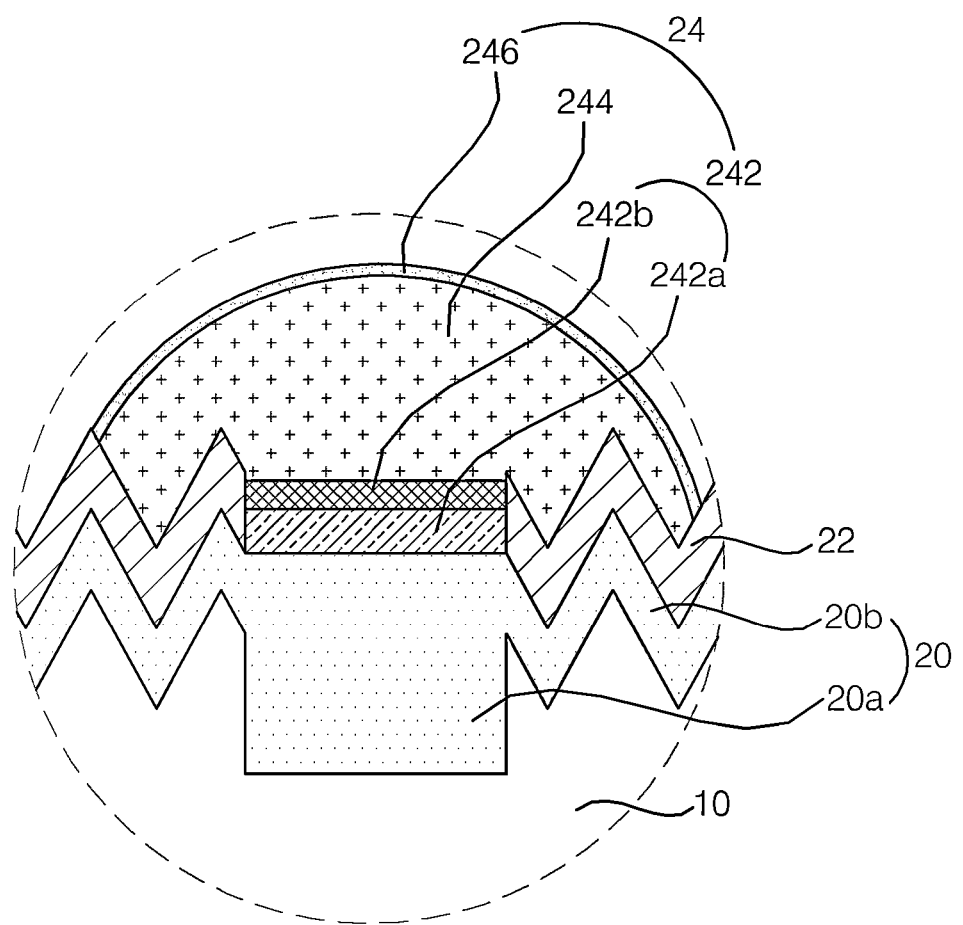

Next, as shown in FIGS. 4c and 4d, a conductive layer 244 and a capping layer 246 are sequentially formed on the barrier layer 242.

The conductive layer 244 and the capping layer 246 may be formed by one or more of various methods (for example, an electro plating method, an electroless plating method, or a deposition method). Because the conductive layer 244 and the capping layer 246 are formed on the barrier layer 242, precise alignment is not necessary, thereby simplifying the process.

The conductive layer 244 may include Cu, Ag, or the like, and the capping layer 246 may include Sn, Ag, or the like. However, the invention is not limited thereto. Thus, the conductive layer 244 and the capping layer 246 may be formed of one or more of various materials.

The conductive layer 244 may be thicker than the barrier layer 242 or the capping layer 246. For example, the conductive layer 244 may have a thickness of about 10~30 μm, and the capping layer 246 may have a thickness of about 1~10 μm (for example, about 5~10 μm).

Also, the conductive layer 244 and the capping layer 246 may be wider than the barrier layer 242, and may be formed on the anti-reflection layer 22 adjacent to both sides of the second layer 242b, as well as on the second layer 242b. For example, the capping layer 246 may have a width of about 10~40 μm (for example, about 10~25 μm).

In the embodiment, the barrier layer 242 of at least one the electrodes 24 and 34 includes the first layer 242a made of the silicide and the second layer 242b made of the metal of the metal layer 241.

The first layer 242a has low contact resistance with the semiconductor substrate 10, has high adhesive force, and has high thermal stability. Accordingly, bonding property between the semiconductor substrate 10 and the electrodes 24 and 34 can be enhanced by the first layer 242a.

Also, the second layer 242b entirely covers the first layer 242a, and thus, effectively prevents problems generated at a portion where the first layer 242a is not formed, and prevents metal diffusion of the conductive layer 244. Therefore, the conductive layer 244 can be made of a cheap metal (for example, Cu), thereby largely reducing the manufacturing cost. Here, the first and second layers 242a and 242b can be formed by forming the metal layer 241 with a sufficient thickness and heat-treating the metal layer 241 at a low temperature. That is, the first and second layers 242a and 242b can be formed by a simple process.

In addition, align errors between the electrodes 24 and 34 and the dopant layers 20 and 30 can be reduced, and thus, the widths of the electrodes 24 and 34 can be decreased. Accordingly, the shading loss can be minimized and the efficiency of the solar cell 100 can be enhanced.

On the other hand, when a printing method using a paste is used for forming an electrode as in the conventional art, there may be an alignment miss. In order to compensate for the alignment miss, the electrode is formed to have a large area. Accordingly, the electrode has a width larger than about 70 μm, and thus, the shading loss increases and the efficiency of the solar cell decreases. Also, in order to prevent contamination of the solar cell generated due to the metal diffusion of the metal of the conductive layer, the electrode is formed by using a precious metal. Thus, the manufacturing cost increases.

Hereinafter, embodiments of the invention will be described in more detail through experimental examples. The experimental examples are provided only for illustrative purpose of the embodiments of the invention and the embodiments of the invention are not limited thereto.

Experimental Embodiments

An n-type semiconductor substrate including silicon was prepared. Boron as a p-type dopant was doped to the front surface of the semiconductor substrate by a thermal diffusion method, and an emitter layer having a selective structure was formed. Phosphorus as an n-type dopant was doped to the back surface of the semiconductor substrate by a thermal diffusion method, and a back surface field layer having a selective structure was formed. An anti-reflection film including a silicon nitride film was formed on the front surface of the semiconductor substrate, and a passivation film including a silicon oxide film and a silicon nitride film was formed on the back surface of the semiconductor substrate. Openings were formed at the anti-reflection film and the passivation film by irradiating laser.

After the metal layer including Ni was formed inside the opening to have a thickness of 1.5 μm, a barrier layer consisting of a first layer consisting of NiSi and a second layer consisting of Ni was formed by heat-treating the metal layer at 300° C. A conductive layer consisting of Cu and a capping layer consisting of Sn were formed. Accordingly, the front and back electrodes were formed and the solar cell was manufactured.

COMPARATIVE EXAMPLE

A solar cell was manufactured by the same method in Experimental Embodiment 1 except that the metal layer was formed to have a thickness of 1.5 μm, was heated at 450° C., and the barrier layer only consisting of NiSi.

Figure 5:
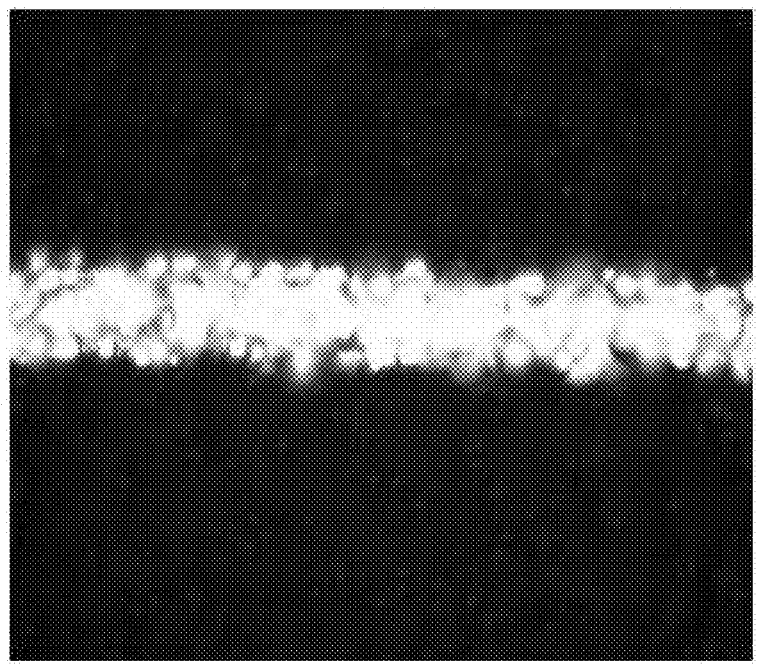
FIG. 5 is an optical microscope image of a barrier layer manufactured by Experimental Embodiment.
Figure 6:
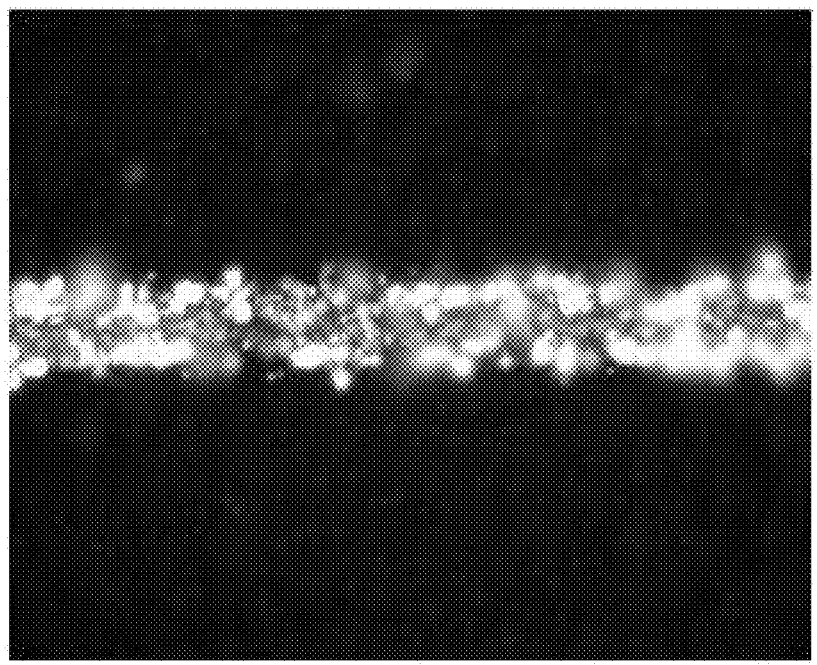
FIG. 6 is an optical microscope image of a barrier layer manufactured by Comparative Example.

An optical microscope image of a barrier layer manufactured by Experimental Embodiment is shown in FIG. 5, and an optical microscope image of a barrier layer manufactured by Comparative Example is shown in FIG. 6. In FIGS. 5 and 6, a portion of the metal layer is bright because the barrier layer has high reflectance.

Referring to FIG. 5, it can be seen that the barrier layer of the electrode manufactured by Experimental Embodiment is uniformly formed and has a sufficient thickness. On the other hand, referring to FIG. 6, in Comparative Example, it can be seen that there is a portion where the barrier layer is not formed. At this portion, the contact resistance may increase, and the material of the conductive layer 244 is diffused toward the semiconductor substrate 10. In severe cases, shunt may be generated.

According to the embodiment, the barrier layer includes the first layer having silicide of superior properties and the second layer covering the first layer. Thus, adhesive property between the semiconductor substrate and the electrode can be enhanced, and the shunt and metal diffusion can be effectively prevented. The first layer and the second layer can be formed by a simple process of heat-treating the metal layer.

Also, the conductive layer, which is formed on the barrier layer and act as a substantive electrode can be made of a cheap metal, thereby largely reducing the manufacturing cost.

In addition, align errors between the electrodes and the dopant layers can be reduced, and thus, the widths of the electrodes can be decreased. Accordingly, the process can be simplified, and the shading loss can be minimized and the efficiency of the solar cell can be enhanced.

Certain embodiments of the invention have been described. However, the invention is not limited to the specific embodiments described above; and various modifications of the embodiments are possible by those skilled in the art to which the invention belongs without leaving the scope defined by the appended claims.

What is claimed is:

1. A method of manufacturing a solar cell, comprising:
   forming a dopant layer by doping a dopant to a semiconductor substrate including silicon; and
   forming an electrode electrically connected to the dopant layer,
   wherein the forming of the electrode comprises:
      forming a barrier metal layer on the dopant layer;
      heat-treating the barrier metal layer to form a first layer and a second layer; and
      forming a conductive layer including a metal different from the barrier metal and is thicker than each of the first layer and the second layer,
   wherein a portion of the barrier metal layer adjacent to the semiconductor substrate forms the first layer comprising a silicide compound formed by a reaction of the barrier metal layer and the semiconductor substrate during the heat-treating, and a remaining portion of the barrier metal layer forms the second layer that covers the first layer,
   wherein the barrier metal comprises a metal selected from a group consisting of Ni, Pt, Ti, Co, W, Mo, Ta, and an alloy thereof, and
   wherein the first layer is thicker than the second layer.

2. The method according to claim 1, wherein the metal layer comprises Ni, and
   wherein the first layer comprises NiSi and the second layer comprises Ni.

3. The method according to claim 1, wherein a thickness ratio of the first layer:the second layer is in a range of about 1:0.1~20.

4. The method according to claim 1, wherein, in the forming of the metal layer, the metal layer has a thickness of about 0.2~2 μm.

5. The method according to claim 1, wherein the first layer has a thickness of about 0.2~2.5 μm, and the second layer has a thickness of about 0.1~1 μm.

6. The method according to claim 1, wherein, in the heat-treating of the metal layer, a heat-treating temperature is in a range of about 250~400° C.

7. The method according to claim 1, wherein, in the heat-treating of the metal layer, a heat-treating temperature is in a range of about 250~300° C.

8. The method according to claim 1,
   wherein the conductive metal layer comprises one a material selected from a group consisting of copper (Cu), tin (Sn), silver (Ag), and an alloy thereof.

9. The method according to claim 1, further comprising:
   forming an insulation film on the dopant layer;
   forming an opening at the insulation film; and
   forming the electrode in the opening of the insulation film.

10. The method according to claim 9, wherein the semiconductor substrate has a surface comprising at least one of protruded and depressed portions formed by texturing, and
    wherein, in the forming of the opening, the at least one of protruded and depressed portions at a portion where the opening is formed is eliminated.

11. The method according to claim 1, wherein, in the forming of the electrode, the electrode is formed by a method selected from a group comprising an electro plating method, an electro-less plating method, and a deposition method.

12. A solar cell, comprising:
a semiconductor substrate including silicon;
a dopant layer formed at the semiconductor substrate; and
an electrode electrically connected to the dopant layer,
wherein the electrode comprises a barrier layer in contact with the semiconductor substrate or the dopant layer and a conductive layer on the barrier layer,
wherein the barrier layer comprises a first layer and a second layer on the first layer,
wherein the second layer comprises a barrier metal, the first layer comprises a metal silicide compound formed by a heat-treatment reaction of the barrier metal and the semiconductor substrate, and the second layer covers the first layer,
wherein the barrier metal comprises a metal selected from a group consisting of Ni, Pt, Ti, Co, W, Mo, Ta, and an alloy thereof,
wherein the first layer is thicker than the second layer,
wherein the conductive layer includes a metal different from the barrier metal and is thicker than each of the first layer and the second layer.

13. The solar cell according to claim 12, wherein the first layer has a thickness of 0.2~2.5 µm, and the second layer has a thickness of 0.1~10 µm.

14. The solar cell according to claim 12, wherein the conductive layer comprises Cu.

15. The solar cell according to claim 12, wherein the electrode further comprises a capping layer on the conductive layer and includes a metal different from the conductive layer, and
wherein the capping layer comprises a metal selected from a group consisting of Sn, Ag, and an alloy thereof.

* * * * *